(12) United States Patent
Lee

(10) Patent No.: US 7,563,674 B2
(45) Date of Patent: Jul. 21, 2009

(54) METHOD OF MANUFACTURING NAND FLASH MEMORY DEVICE

(75) Inventor: Byoung Ki Lee, Kyeongki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 39 days.

(21) Appl. No.: 11/605,130

(22) Filed: Nov. 28, 2006

(65) Prior Publication Data

US 2008/0003743 A1    Jan. 3, 2008

(30) Foreign Application Priority Data

Jun. 29, 2006  (KR)  ....................... 10-2006-0059797

(51) Int. Cl.
*H01L 21/336* (2006.01)

(52) U.S. Cl. .................. 438/257; 438/201; 438/211; 438/264; 438/594; 257/E21.179; 257/E21.209; 257/E21.682

(58) Field of Classification Search .............. 438/201, 438/211, 257, 264, 594; 257/E21.179, E21.209, 257/E21.682
See application file for complete search history.

(56) References Cited

U.S. PATENT DOCUMENTS

| 6,559,030 | B1 * | 5/2003 | Doan et al. ................ 438/432 |
|---|---|---|---|
| 6,576,565 | B1 * | 6/2003 | Chakravarti et al. ......... 438/758 |
| 6,613,629 | B2 * | 9/2003 | Kim et al. ................... 438/253 |
| 6,878,588 | B2 * | 4/2005 | Dong et al. ................. 438/257 |
| 6,881,318 | B2 * | 4/2005 | Hey et al. ..................... 205/87 |
| 7,125,769 | B2 * | 10/2006 | Dong .......................... 438/257 |
| 7,256,091 | B2 * | 8/2007 | Kim et al. ................... 438/264 |
| 7,297,593 | B2 * | 11/2007 | Kim .......................... 438/257 |
| 2003/0119256 | A1 * | 6/2003 | Dong et al. ................. 438/257 |
| 2004/0106256 | A1 * | 6/2004 | Dong et al. ................. 438/257 |
| 2004/0126972 | A1 * | 7/2004 | Dong et al. ................. 438/259 |
| 2005/0142765 | A1 * | 6/2005 | Joo ............................ 438/264 |
| 2005/0287763 | A1 * | 12/2005 | Kim et al. ................... 438/424 |
| 2006/0281261 | A1 * | 12/2006 | Kim .......................... 438/264 |
| 2006/0292794 | A1 * | 12/2006 | Joo ............................ 438/257 |

FOREIGN PATENT DOCUMENTS

KR    10-2006-0122139 A    11/2006

* cited by examiner

*Primary Examiner*—Andy Huynh
(74) *Attorney, Agent, or Firm*—Marshall, Gerstein & Borun LLP

(57) ABSTRACT

A method of manufacturing a NAND flash memory device, wherein isolation layers are formed in a semiconductor substrate, and an upper side of each of the isolation layers is made to have a negative profile. A polysilicon layer is formed on the entire surface. At this time, a seam is formed within the polysilicon layer due to the negative profile. A post annealing process is performed in order to make the seam to a void. Accordingly, an electrical interference phenomenon between cells can be reduced and a threshold voltage (Vt) shift value can be lowered.

5 Claims, 3 Drawing Sheets

METHOD OF MANUFACTURING NAND FLASH MEMORY DEVICE

BACKGROUND OF THE INVENTION

1. Field of the Invention

The invention relates, in general, to NAND flash memory devices and, more particularly, to a method of manufacturing a NAND flash memory device, wherein an electrical interference phenomenon occurring between cells can be reduced by reducing the area of a floating gate.

2. Related Technology

In the manufacture of NAND flash memory, a space in which a unit active region and a unit field region will be formed is decreased in size due to higher integration of devices. For this reason, a dielectric layer and a control gate as well as a floating gate are formed within a narrow active space. Accordingly, an interference phenomenon becomes problematic due to the narrow gap between the gates.

FIG. 1 is a perspective view illustrating a known general method of manufacturing a NAND flash memory device employing Self-Aligned Shallow Trench Isolation (ST-STI). FIG. 1 is shown to describe an electrical interference phenomenon between cells.

Referring to FIG. 1, a tunnel oxide layer 11 and a first polysilicon layer 12 are sequentially formed on a semiconductor substrate 10. The first polysilicon layer 12 and the tunnel oxide layer 11 are selectively etched by an etch process using an isolation mask. The semiconductor substrate 10 is etched using the selectively etched first polysilicon layer 12 as a mask, thus forming trenches.

An insulating layer, such as a High Density Plasma (HDP) oxide layer, is then formed on the entire surface so that the trenches are gap-filled. The insulating layer is polished (for example, by Chemical Mechanical Polishing (CMP)) so that a top surface of the first polysilicon layer 12 is exposed, thus forming isolation layers 13 within the trenches. A second polysilicon layer 14 is formed on the entire surface. The second polysilicon layer 14 is etched using a mask, forming a floating gate including the first polysilicon layer 12 and the second polysilicon layer 14. A dielectric layer 15 and a conductive layer 16 for a control gate are formed on the entire surface.

If the floating gate is formed by the above method, the width of the isolation layer is narrowed due to high device integration. Accordingly, a distance between neighboring floating gate is reduced and, therefore, an interference phenomenon occurs between the neighboring floating gates. The interference phenomenon between the neighboring floating gates is generated because an HDP oxide layer near a tunnel oxide layer serves as a dielectric material. Such a phenomenon can be prevented by etching the top surface of the isolation layer up to a region below the tunnel oxide layer and then gap-filling the polysilicon layer for the control gate up to a region below the tunnel oxide layer.

If the height of the floating gate is reduced, however, the interference phenomenon between the gates is reduced, but the coupling ratio and the program speed of a cell are decreased.

FIG. 2 is a graph illustrating program threshold voltages Vt and interference threshold voltage (Vt) shift values depending on the miniaturization of a device.

In FIG. 2, a curve "a" is a graph indicating an interference threshold voltage (Vt) shift value of a cell depending on each device, and curve "b" is a graph indicating a program threshold voltage (Vt) value depending on each device. From the curves "a" and "b," it can be seen that as the device shrinks, the interference threshold voltage (Vt) shift value increases but the program threshold voltage (Vt) value decreases, and in the devices of 60 nm or less, both the program threshold voltage (Vt) value and the interference threshold voltage (Vt) shift value exceed a limit value of the devices.

SUMMARY OF THE INVENTION

Accordingly, the invention addresses the above problems, and provides a method of manufacturing a NAND flash memory device, wherein an electrical interference phenomenon occurring between cells can be reduced by reducing the area of the floating gate.

According to one aspect, the invention provides a method of manufacturing a NAND flash memory device, including the steps of forming isolation layers in a semiconductor substrate, making an upper side of each of the isolation layers has a negative profile, forming a polysilicon layer on the entire surface, wherein a seam is formed within the polysilicon layer due to the negative profile, and performing a post annealing process, thus making the seam to a void.

According to another aspect, the invention provides a method of manufacturing a NAND flash memory device, including the steps of sequentially laminating a tunnel oxide layer, a first polysilicon layer, a buffer oxide layer and a nitride layer on a semiconductor substrate, and etching portions of the tunnel oxide layer, the first polysilicon layer, the buffer oxide layer, the nitride layer and the semiconductor substrate, thus forming trenches, wherein a side of the nitride layer has a slope; forming an insulating layer within the trenches, forming isolation layers within the trenches; sequentially stripping the exposed nitride layer and buffer oxide layer so that an upper side of each of the isolation layer has a negative profile due to the slope; forming a second polysilicon layer on the entire surface, wherein a seam is formed within the second polysilicon layer due to the negative profile; performing a post annealing process, thus making the seam void; performing a polishing process until the top surfaces of the isolation layers are exposed, and stripping a portion of the top surfaces of the isolation layers; and sequentially forming a dielectric layer and a third polysilicon layer on the entire surface.

DESCRIPTION OF SPECIFIC EMBODIMENTS

Specific embodiments according to the invention are described below with reference to the accompanying drawings.

FIGS. 3A to 3E are cross-sectional views illustrating a method of manufacturing a NAND flash memory device according to an embodiment of the invention. A Self-Aligned Shallow Trench Isolation (SA-STI) structure to which a Self-Aligned Floating Gate (SA-FG) scheme is applied is shown in FIG. 3.

Figure 1:
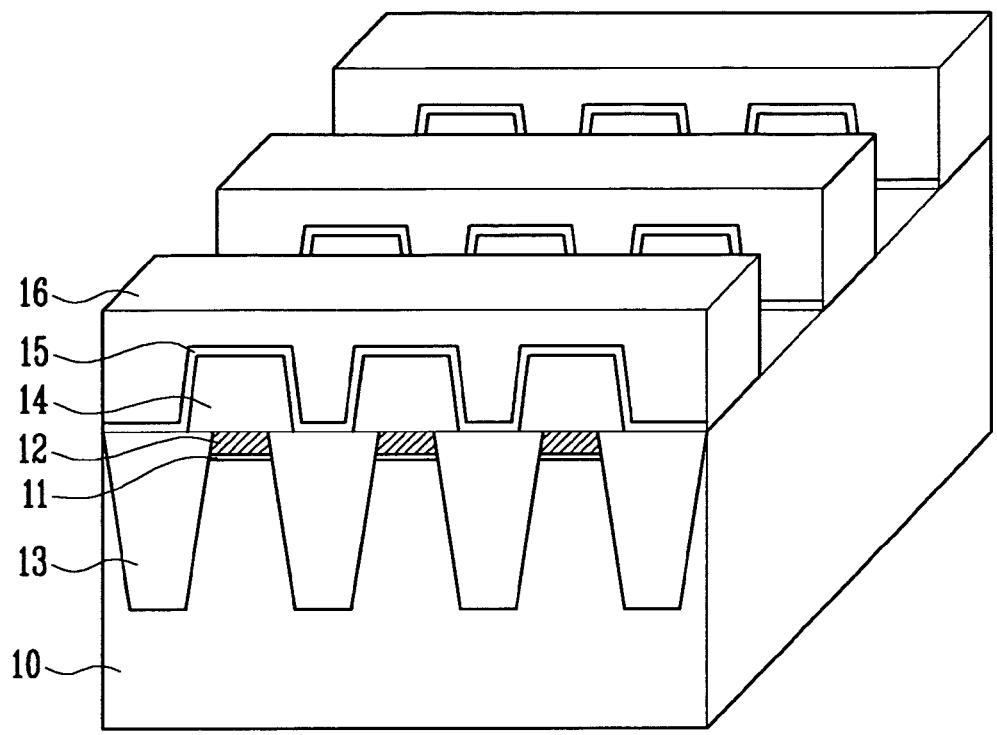
FIG. 1 is a perspective view of a NAND flash memory device for illustrating a conventional method of manufacturing the device.
Figure 2:
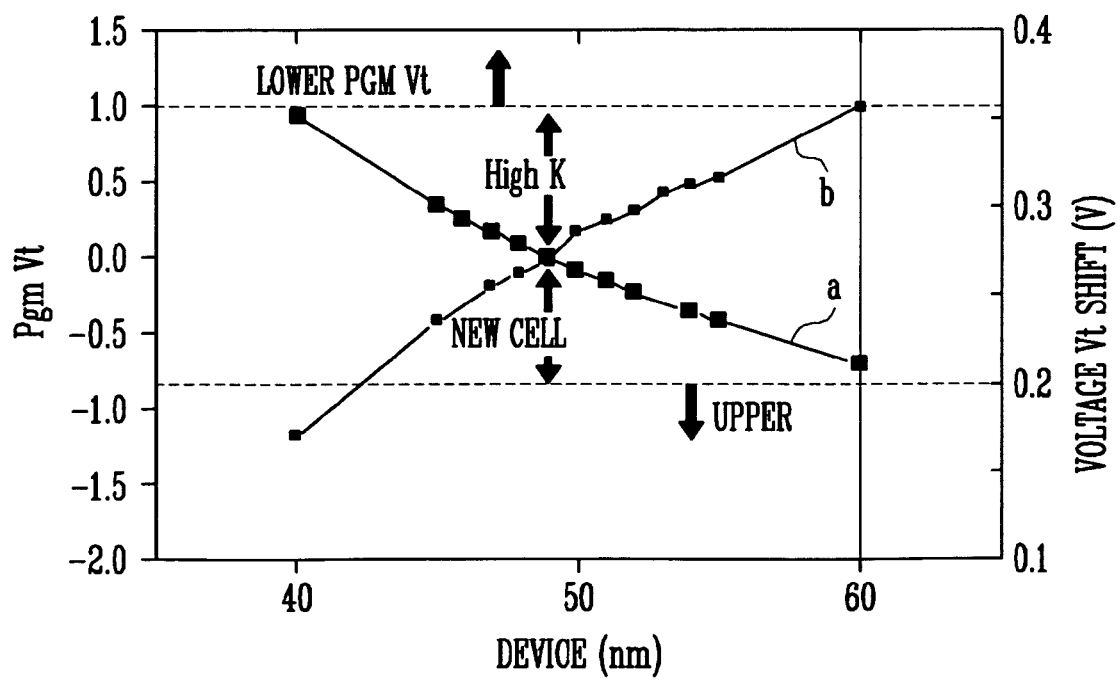
FIG. 2 is a graph illustrating program threshold voltages Vt and interference threshold voltage (Vt) shift values depending on the miniaturization of a device.
Figure 3A:
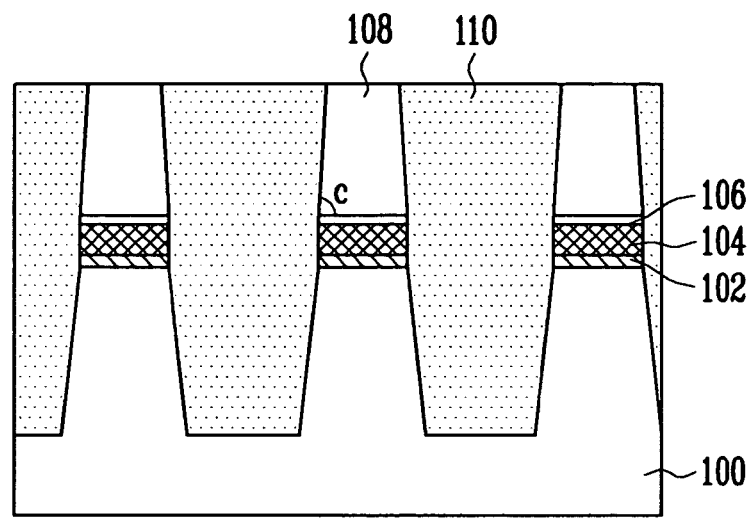
FIGS. 3A to 3F are cross-sectional views illustrating a method of manufacturing a NAND flash memory device according to an embodiment of the invention.

Referring to FIG. 3A, a tunnel oxide layer 102, a first polysilicon layer 104 for a floating gate, a buffer oxide layer 106 and a nitride layer 108 are sequentially formed on a semiconductor substrate 100. The first polysilicon layer 104 is preferably formed to a thickness of 300 Å to 500 Å, the buffer oxide layer 106 is preferably formed to a thickness of 30 Å to 80 Å, and the nitride layer 108 is preferably formed to a thickness of 600 Å to 1200 Å.

Portions of the nitride layer 108, the buffer oxide layer 106, the first polysilicon layer 104, the tunnel oxide layer 102 and the semiconductor substrate 100 are sequentially etched, preferably by photo and etch processes, thus forming trenches. At this time of the etch process, a slope c on the side of the nitride layer 108 is preferably set within a range of 84 degrees to 87 degrees.

A sidewall oxide layer is formed within the trenches. An insulating layer is formed on the entire surface so that the trenches are gap-filled. The insulating layer is preferably formed of a HDP oxide layer. The insulating layer is then polished to expose a top surface of the nitride layer 108, thus forming isolation layers 110 within the trenches.

Figure 3B:
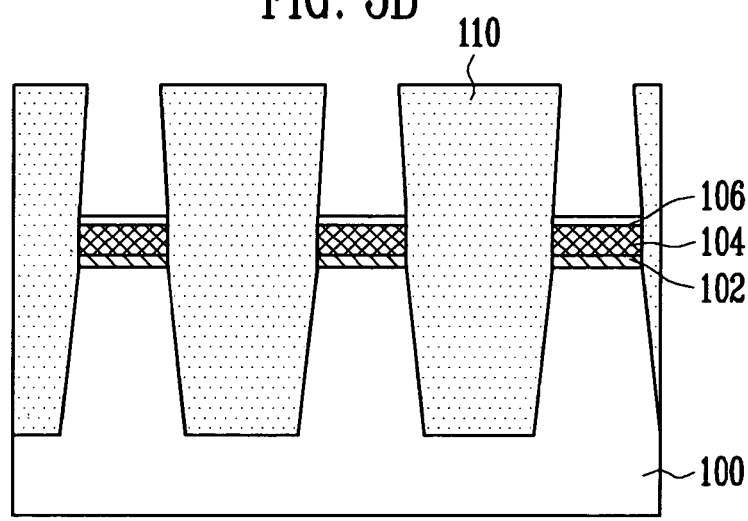

Referring to FIG. 3B, the nitride layer 108 is stripped, preferably in a hot phosphoric acid bath. During the strip process of the nitride layer 108, the first polysilicon layer 104 is not attached since the buffer oxide layer 106 is formed on the first polysilicon layer 104. A nipple region on the isolation layers 110 has a negative slope.

Figure 3C:
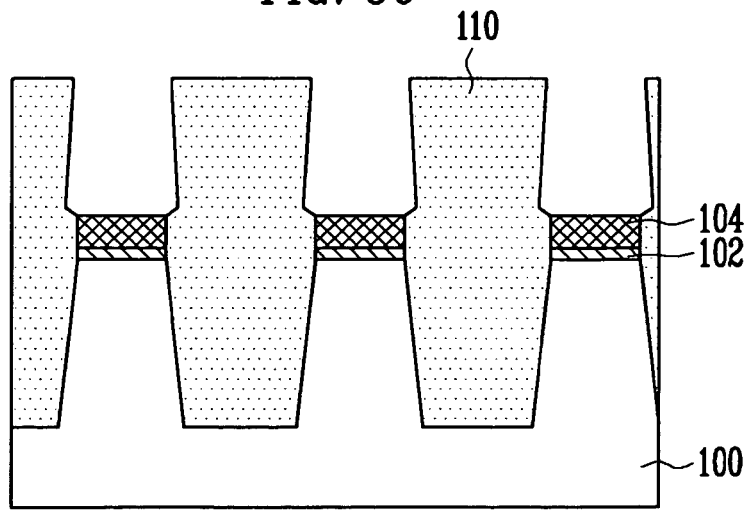

Referring to FIG. 3C, the buffer oxide layer 106 is stripped, preferably by a cleaning process. When the buffer oxide layer 106 is stripped, a portion of the side of the isolation layer 110 is also stripped.

Figure 3D:
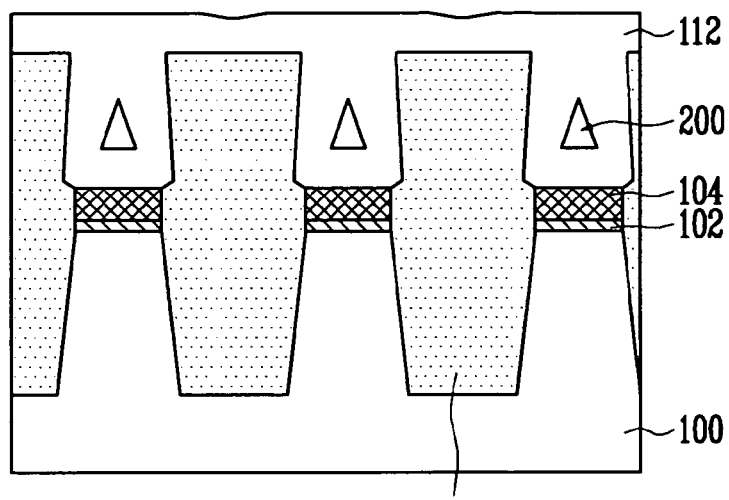

Referring to FIG. 3D, a second polysilicon layer 112 for a floating gate is formed on the entire surface. During the formation process of the second polysilicon layer, a seam 200 is generated between the isolation layers 110 due to an isolation layer 110 having a negative slope.

Figure 3E:
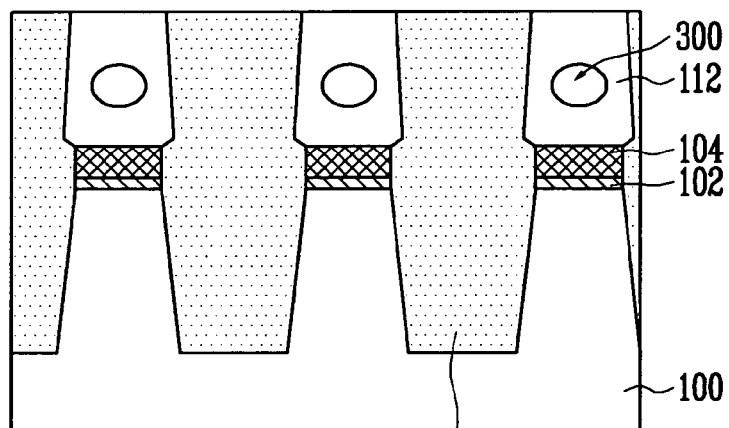

Referring to FIG. 3E, a post annealing process is performed in order to make the seam 200 to void 300. The post annealing process is preferably performed under $N_2$, vacuum, or $H_2$ atmosphere at a temperature of 700° C. to 900° C. by using a Rapid Thermal Process (RTP) type or a furnace type process.

Thereafter, a polishing process or an etch-back process is performed until top surfaces of the isolation layers 110 are exposed, so that the second polysilicon layers 112 are separated from each other. The second polysilicon layer 112 preferably has a thickness of 400 Å to 800 Å.

Figure 3F:
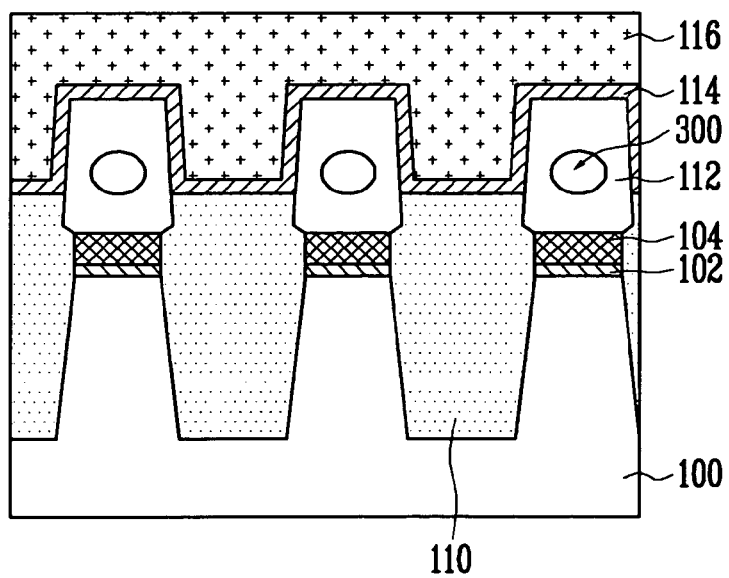

Referring to FIG. 3F, top surfaces of the isolation layers 110 are partially etched in order to control an Effective Field Height (EFH) of the isolation layers 110. The EFH preferably becomes 250 Å to 450 Å in thickness. A dielectric layer 114 and a third polysilicon layer 116 for a control gate are sequentially formed on the entire surface.

If the floating gate is formed as described above, a void is generated at the center of the floating gate, which reduces the area of the floating gate. Due to this, an electrical interference phenomenon between cells is reduced, resulting in a low threshold voltage (Vt) shift value. Accordingly, in NAND flash memory devices of 60 nm or less, multi-level cells can be implemented.

As described above, the invention has the following advantages.

First, a void is formed at the center of a floating gate and the area of the floating gate is reduced accordingly. It is therefore possible to reduce an electrical interference phenomenon between cells.

Second, since an electrical interference phenomenon between cells is reduced, a threshold voltage (Vt) shift value can be lowered.

Third, since an electrical interference phenomenon between cells is reduced, multi-level cells can be implemented in NAND flash memory devices of 60 nm or less.

Although the foregoing description has been made with reference to various embodiments, changes and modifications may be made by those of ordinary skill in the art without departing from the spirit and scope of the invention.

What is claimed is:

1. A method of manufacturing a NAND flash memory device, the method comprising:
    sequentially laminating a tunnel oxide layer, a first polysilicon layer, a buffer oxide layer, and a nitride layer on a semiconductor substrate, and etching portions of the tunnel oxide layer, the first polysilicon layer, the buffer oxide layer, the nitride layer, and the semiconductor substrate, thus forming trenches, wherein a side of the nitride layer has a slope;
    forming an insulating layer within the trenches, and forming isolation layers within the trenches;
    sequentially stripping the exposed nitride layer and buffer oxide layer so that an upper side of each of the isolation layer has a negative profile due to the slope;
    forming a second polysilicon layer on the entire surface, thereby forming a seam within the second polysilicon layer due to the negative profile;
    performing a post annealing process, thereby making the seam into a void;
    performing a polishing process until the top surfaces of the isolation layers are exposed, and stripping a portion of the top surfaces of the isolation layers; and
    sequentially forming a dielectric layer and a third polysilicon layer on the entire surface.

2. The method of claim 1, wherein the side of each of the isolation layers has a slope of 84 degrees to 87 degrees.

3. The method of claim 1, comprising performing the post annealing process under N2, vacuum, or H2 atmosphere at a temperature of 700° C. to 900° C. by using a Rapid Thermal Process (RTP) type or a furnace type process.

4. The method of claim 1, comprising performing the polishing process using a Chemical-Mechanical Polishing process or an etch-back process.

5. The method of claim 1, wherein at the time of the polishing process, the second polysilicon layer is 400 Å to 800 Å in thickness.

* * * * *